(12) United States Patent
Carey et al.

(10) Patent No.: US 7,599,157 B2
(45) Date of Patent: *Oct. 6, 2009

(54) CURRENT-PERPENDICULAR-TO-THE-PLANE (CPP) MAGNETORESISTIVE SENSOR WITH HIGH-RESISTIVITY AMORPHOUS FERROMAGNETIC LAYERS

(75) Inventors: Matthew J. Carey, San Jose, CA (US); Jeffrey R. Childress, San Jose, CA (US); Stefan Maat, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 430 days.

This patent is subject to a terminal disclaimer.

(21) Appl. No.: 11/356,546

(22) Filed: Feb. 16, 2006

(65) Prior Publication Data

US 2007/0188937 A1 Aug. 16, 2007

(51) Int. Cl.
*G11B 5/39* (2006.01)
(52) U.S. Cl. .............................. 360/324.11; 360/324.12
(58) Field of Classification Search .............. 360/324.1, 360/324.11, 324.12, 324.2
See application file for complete search history.

(56) References Cited

U.S. PATENT DOCUMENTS

| 5,465,185 | A | 11/1995 | Heim et al. |
| 6,114,850 | A | 9/2000 | Hayashi |
| 6,195,240 | B1 | 2/2001 | Gill |
| 6,356,419 | B1 | 3/2002 | Gill |
| 6,548,186 | B1 | 4/2003 | Carey et al. |
| 6,903,909 | B2 * | 6/2005 | Sharma et al. ........... 360/324.2 |
| 7,265,949 | B2 * | 9/2007 | Hayashi et al. ......... 360/324.12 |
| 7,369,373 | B2 * | 5/2008 | Gill ....................... 360/324.12 |
| 2002/0191354 | A1 * | 12/2002 | Yoshikawa et al. ....... 360/324.1 |
| 2003/0184925 | A1 * | 10/2003 | Hasegawa et al. ...... 360/324.12 |
| 2003/0197988 | A1 * | 10/2003 | Hasegawa et al. ...... 360/324.12 |
| 2005/0110004 | A1 | 5/2005 | Parkin et al. |
| 2005/0118458 | A1 | 6/2005 | Slaughter et al. |
| 2005/0185454 | A1 | 8/2005 | Brown et al. |

(Continued)

OTHER PUBLICATIONS

Tanaka et al., "Spin-valve heads in the current-perpendicular-to-plane mode for ultrahigh-density recording", IEEE Transactions on Magnetics, 38 (1): 84-88 Part 1 Jan. 2002.

(Continued)

*Primary Examiner*—Jefferson Evans
(74) *Attorney, Agent, or Firm*—Thomas R. Berthold

(57) ABSTRACT

A current-perpendicular-to-the-plane spin-valve (CPP-SV) magnetoresistive sensor has a high-resistivity amorphous ferromagnetic alloy in the free layer and/or the pinned layer. The sensor may have an antiparallel (AP)-pinned structure, in which case the AP2 layer may be formed of the high-resistivity amorphous ferromagnetic alloy. The amorphous alloy is an alloy of one or more elements selected from Co, Fe and Ni, and at least one nonmagnetic element X. The additive element or elements is present in an amount that renders the otherwise crystalline alloy amorphous and thus substantially increases the electrical resistivity of the layer. As a result the resistance of the active region of the sensor is increased. The amount of additive element or elements is chosen to be sufficient to render the alloy amorphous but not high enough to substantially reduce the magnetic moment M or bulk electron scattering parameter β.

18 Claims, 4 Drawing Sheets

U.S. PATENT DOCUMENTS

| | | | |
|---|---|---|---|
| 2005/0195534 A1* | 9/2005 | Gill | 360/324.12 |
| 2005/0207071 A1* | 9/2005 | Sato et al. | 360/324.2 |
| 2006/0125034 A1* | 6/2006 | Ohba et al. | 257/421 |
| 2006/0141640 A1* | 6/2006 | Huai et al. | 438/3 |
| 2006/0256484 A1* | 11/2006 | Sato et al. | 360/324.2 |
| 2007/0035886 A1* | 2/2007 | Kagami et al. | 360/319 |
| 2007/0111332 A1* | 5/2007 | Zhao et al. | 438/3 |
| 2007/0154740 A1* | 7/2007 | Yuasa et al. | 428/812 |
| 2007/0228501 A1* | 10/2007 | Nakamura et al. | 257/421 |
| 2007/0253122 A1* | 11/2007 | Fukuzawa et al. | 360/324.11 |
| 2007/0297102 A1* | 12/2007 | Gill | 360/324.11 |
| 2008/0225583 A1* | 9/2008 | Guo et al. | 365/173 |
| 2009/0108383 A1* | 4/2009 | Horng et al. | 257/421 |

OTHER PUBLICATIONS

Fukuzawa et al., "MR Ratio Enhancement by NOL Current Confined Path Structures in CPP Spin Valves", IEEE Transactions on Magnetics, vol. 40, No. 4, Jul. 2004, pp. 2236-2238.

Oshima et al., "Current-perpendicular spin valves . . . layers for ultrahigh-density magnetic recording", IEEE Transactions on Magnetics, vol. 39, No. 5, Sep. 2003, pp. 2377-2380.

* cited by examiner

CURRENT-PERPENDICULAR-TO-THE-PLANE (CPP) MAGNETORESISTIVE SENSOR WITH HIGH-RESISTIVITY AMORPHOUS FERROMAGNETIC LAYERS

BACKGROUND OF THE INVENTION

1. Field of the Invention

The invention relates generally to a current-perpendicular-to-the-plane (CPP) magnetoresistive sensor that operates with the sense current directed perpendicularly to the planes of the layers making up the sensor stack, and more particularly to a CPP sensor with improved ferromagnetic layers.

2. Background of the Invention

One type of conventional magnetoresistive sensor used as the read head in magnetic recording disk drives is a "spin-valve" (SV) sensor. A SV magnetoresistive sensor has a stack of layers that includes two ferromagnetic layers separated by a nonmagnetic electrically conductive spacer layer, which is typically copper (Cu). One ferromagnetic layer has its magnetization direction fixed, such as by being pinned by exchange coupling with an adjacent antiferromagnetic layer, and the other ferromagnetic layer has its magnetization direction "free" to rotate in the presence of an external magnetic field. With a sense current applied to the sensor, the rotation of the free-layer magnetization relative to the fixed-layer magnetization is detectable as a change in electrical resistance.

In a magnetic recording disk drive SV read sensor or head, the magnetization of the fixed or pinned layer is generally perpendicular to the plane of the disk, and the magnetization of the free layer is generally parallel to the plane of the disk in the absence of an external magnetic field. When exposed to an external magnetic field from the recorded data on the disk, the free-layer magnetization will rotate, causing a change in electrical resistance. If the sense current flowing through the SV is directed parallel to the planes of the layers in the sensor stack, the sensor is referred to as a current-in-the-plane (CIP) sensor, while if the sense current is directed perpendicular to the planes of the layers in the sensor stack, it is referred to as current-perpendicular-to-the-plane (CPP) sensor. CPP-SV read heads are described by A. Tanaka et al., "Spin-valve heads in the current-perpendicular-to-plane mode for ultra-high-density recording", IEEE TRANSACTIONS ON MAGNETICS, 38 (1): 84-88 Part 1 JANUARY 2002.

The fixed or pinned ferromagnetic layer in a CPP-SV sensor used in read heads may be a single pinned layer or an antiparallel (AP) pinned structure. The AP-pinned structure has first (AP1) and second (AP2) ferromagnetic layers separated by a nonmagnetic antiparallel coupling (APC) layer with the magnetization directions of the two AP-pinned ferromagnetic layers oriented substantially antiparallel. The AP2 layer, which is in contact with the nonmagnetic APC layer on one side and the sensor's Cu spacer on the other side, is typically referred to as the reference layer. The AP1 layer, which is typically in contact with an antiferromagnetic or hard magnet pinning layer on one side and the nonmagnetic APC layer on the other side, is typically referred to as the pinned layer. If the AP-pinned structure is the "self-pinned" type, then no pinning layer is required. In a self-pinned structure where no antiferromagnet or hard magnet pinning layer is present, the AP1 layer is in contact with a seed layer on the sensor substrate. The AP-pinned structure minimizes magnetostatic coupling between the reference layer and the CPP-SV free ferromagnetic layer. The AP-pinned structure, also called a "laminated" pinned layer, and sometimes called a synthetic antiferromagnet (SAF), is described in U.S. Pat. No. 5,465,185.

In CPP-SV sensors, because the sense current flows perpendicular to all the layers in the sensor stack, the electrical resistance of the active region (the free layer, spacer layer and pinned layer) is a relatively small part of the total resistance of the sensor. For example, the antiferromagnetic layer, which is used for pinning the pinned layer and is not part of the active region, has a very high electrical resistivity and can account for more than 90% of the total stack resistance. It is thus desirable to increase the resistance of the active region without significantly increasing the total stack resistance. One approach to achieving this is sometimes called a confined-current-path (CCP) sensor, wherein the sense current is forced to pass though only a portion of the area of the sensor stack. One type of CCP CPP-SV sensor has a partially-oxidized nano-oxide layer (NOL) in the active region, typically in the conductive spacer layer. The sense current is confined to flow only though the conductive non-oxidized areas of the NOL. The NOL thus increases both the resistance and the AR of the active region and therefore increases the magnetoresistance ($\Delta R/R$) of the sensor. CPP-SV sensors with NOLs are described by Oshima et al., "Current-perpendicular spin valves with partially oxidized magnetic layers for ultrahigh-density magnetic recording", IEEE Transactions on Magnetics, Vol. 39, No. 5, September 2003, pp. 2377-2380; and by Fukuzawa, et al., "MR Enhancement by NOL Current-Confined-Path Structures in CPP Spin Valves", IEEE Transactions on Magnetics, Vol. 40, No. 4, July 2004, pp. 2236-2238. However, because the formation of the conductive paths in the NOL is by oxidation and annealing of a very thin layer, the number and size of the conductive non-oxidized areas depends on the material properties, layer thickness, oxidation time, and anneal conditions. As a result it is difficult to reliably manufacture large quantities of CPP-SV sensors with NOLs with predictable values of R and $\Delta R/R$. Moreover, the size and shape of the conductance paths has a statistical distribution that cannot be easily controlled, yielding unwanted large distributions for R and $\Delta R/R$ within a given group of devices.

The materials making up the free layer and the pinned layer (either the single pinned layer or the AP2 layer in an AP-pinned structure) are typically crystalline alloys of CoFe or NiFe. These materials have a relatively low electrical resistivity and thus do not contribute significantly to the resistance of the active region.

What is needed is a CPP-SV sensor with improved ferromagnetic materials for the free and pinned layers that increase the electrical resistance of the active region of the sensor without significantly degrading the sensor's magnetic properties.

SUMMARY OF THE INVENTION

The invention is a CPP-SV magnetoresistive sensor with a high-resistivity amorphous ferromagnetic alloy in the free layer and/or the pinned layer structure. The sensor may be a simple pinned structure, in which case the pinned layer may be formed of a high-resistivity amorphous ferromagnetic alloy. Alternatively, the sensor may have an AP-pinned layer structure, in which case the AP2 layer may be formed of a high-resistivity amorphous ferromagnetic alloy. The sensor may also be a dual-spin-valve sensor, where two similar pinned layer structures are arrange symmetrically on either side of a single free layer structure. The free layer structure may be a standard free layer structure, or (in the case of a single-spin-valve) an AP-pinned free layer of two magnetic layers of unequal magnetization coupled antiparallel to each other. The amorphous alloy is an alloy of one or more elements selected from Co, Fe and Ni, and at least one nonmagnetic element X. The additive element or elements is present in an amount that renders the otherwise crystalline alloy amorphous and thus substantially increases the electrical resistivity of the layer. As a result the resistance of the active region of the sensor is increased. The amount of additive element or elements is chosen to be sufficient to render the alloy amorphous but not high enough to substantially reduce the magnetic moment M or bulk electron scattering parameter β. Examples of materials for the amorphous alloys include $Co_{(100-x-y)}Fe_xX_y$ and $Ni_{(100-x-y)}Fe_xX_y$ where X is B or Tb, and y is between about 5 and 40 atomic percent (at. %).

For a fuller understanding of the nature and advantages of the present invention, reference should be made to the following detailed description taken together with the accompanying figures.

DETAILED DESCRIPTION OF THE INVENTION

Figure 1:
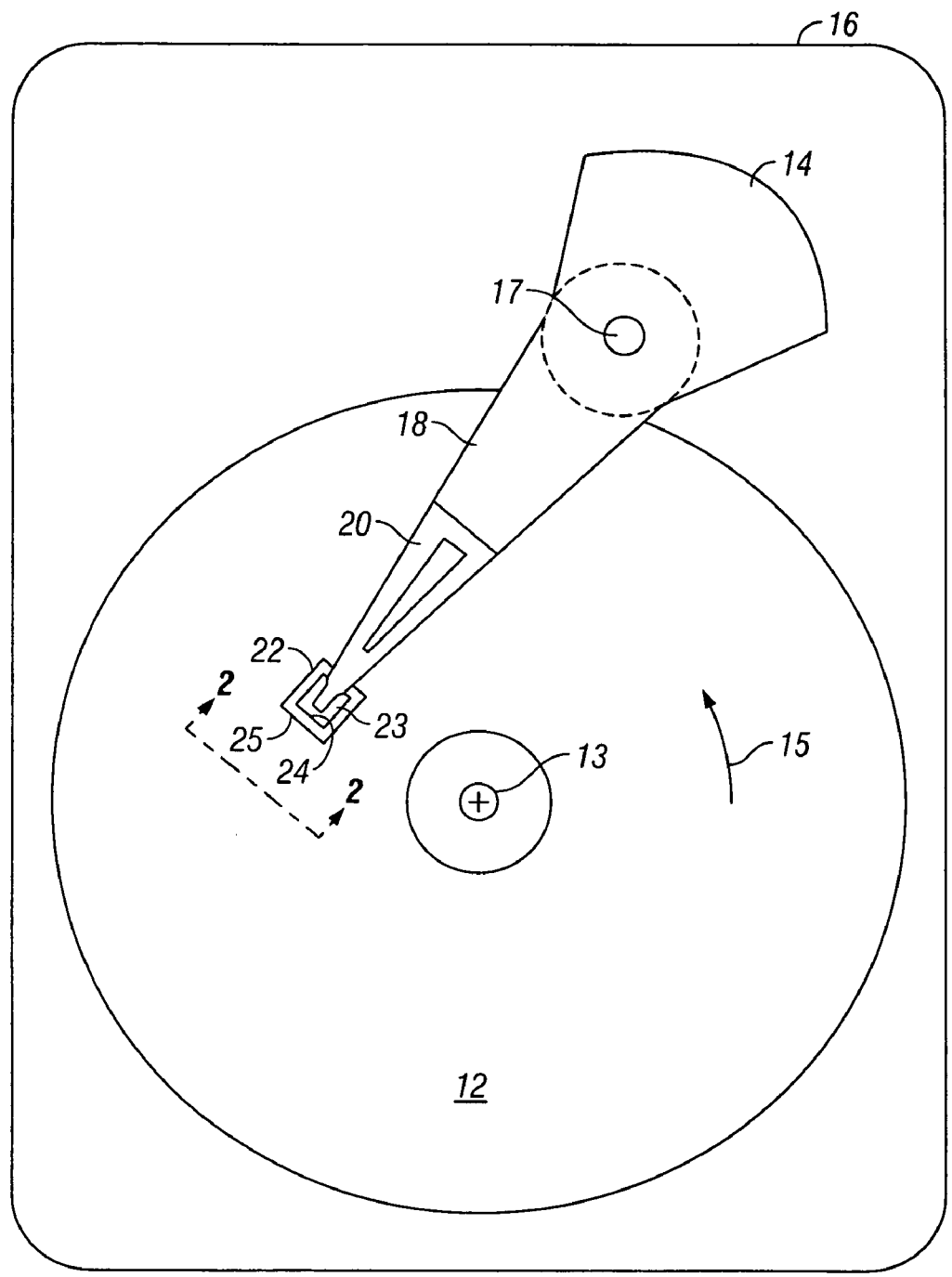
FIG. 1 is a schematic top view of a conventional magnetic recording hard disk drive with the cover removed.

The CPP-SV read head has application for use in a magnetic recording disk drive, the operation of which will be briefly described with reference to FIGS. 1-3. FIG. 1 is a block diagram of a conventional magnetic recording hard disk drive. The disk drive includes a magnetic recording disk 12 and a rotary voice coil motor (VCM) actuator 14 supported on a disk drive housing or base 16. The disk 12 has a center of rotation 13 and is rotated in direction 15 by a spindle motor (not shown) mounted to base 16. The actuator 14 pivots about axis 17 and includes a rigid actuator arm 18. A generally flexible suspension 20 includes a flexure element 23 and is attached to the end of arm 18. A head carrier or air-bearing slider 22 is attached to the flexure 23. A magnetic recording read/write head 24 is formed on the trailing surface 25 of slider 22. The flexure 23 and suspension 20 enable the slider to "pitch" and "roll" on an air-bearing generated by the rotating disk 12. Typically, there are multiple disks stacked on a hub that is rotated by the spindle motor, with a separate slider and read/write head associated with each disk surface.

Figure 2:
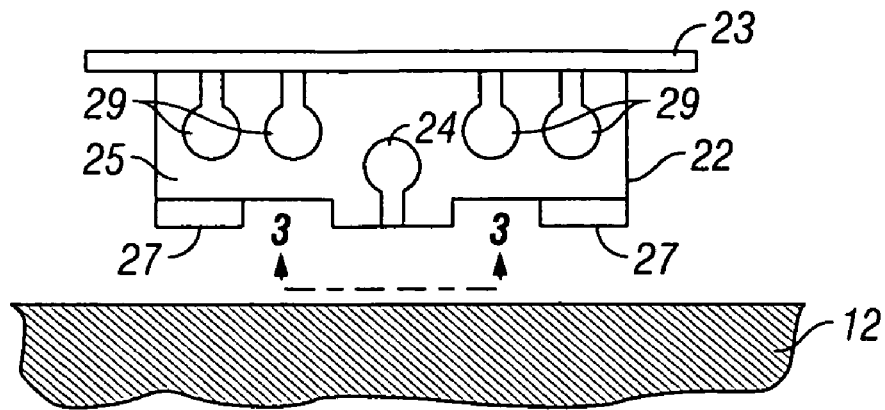
FIG. 2 is an enlarged end view of the slider and a section of the disk taken in the direction 2-2 in FIG. 1.

FIG. 2 is an enlarged end view of the slider 22 and a section of the disk 12 taken in the direction 2-2 in FIG. 1. The slider 22 is attached to flexure 23 and has an air-bearing surface (ABS) 27 facing the disk 12 and a trailing surface 25 generally perpendicular to the ABS. The ABS 27 causes the airflow from the rotating disk 12 to generate a bearing of air that supports the slider 20 in very close proximity to or near contact with the surface of disk 12. The read/write head 24 is formed on the trailing surface 25 and is connected to the disk drive read/write electronics by electrical connection to terminal pads 29 on the trailing surface 25.

Figure 3:
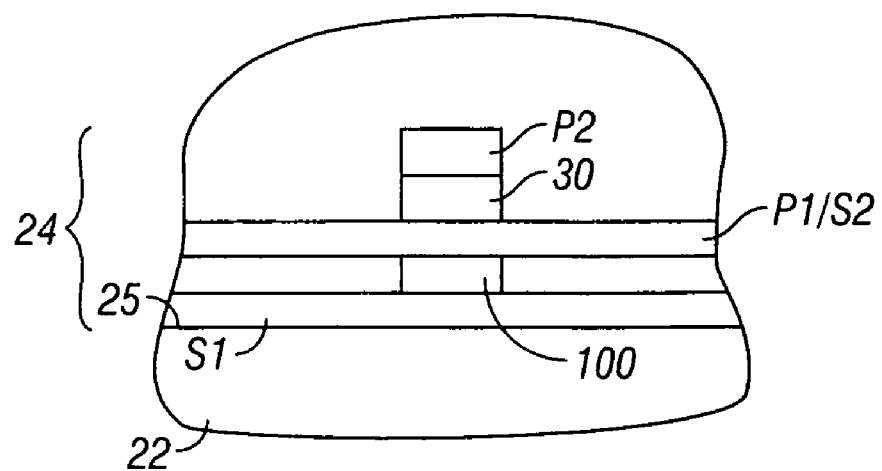
FIG. 3 is a view in the direction 3-3 of FIG. 2 and shows the ends of the read/write head as viewed from the disk.

FIG. 3 is a view in the direction 3-3 of FIG. 2 and shows the ends of read/write head 24 as viewed from the disk 12. The read/write head 24 is a series of thin films deposited and lithographically patterned on the trailing surface 25 of slider 22. The write head includes magnetic write poles P1/S2 and P1 separated by a write gap 30. The CPP-SV magnetoresistive sensor or read head 100 is located between two magnetic shields S1 and P1/S2, with P1/S2 also serving as the first write pole for the write head. The shields S1, S2 are formed of magnetically permeable material and are electrically conductive so they can function as the electrical leads to the read head 100. Separate electrical leads may also be used, in which case the read head 100 is formed in contact with layers of electrically conducting lead material, such as tantalum, gold, or copper, that are in contact with the shields S1, S2.

Figure 4:
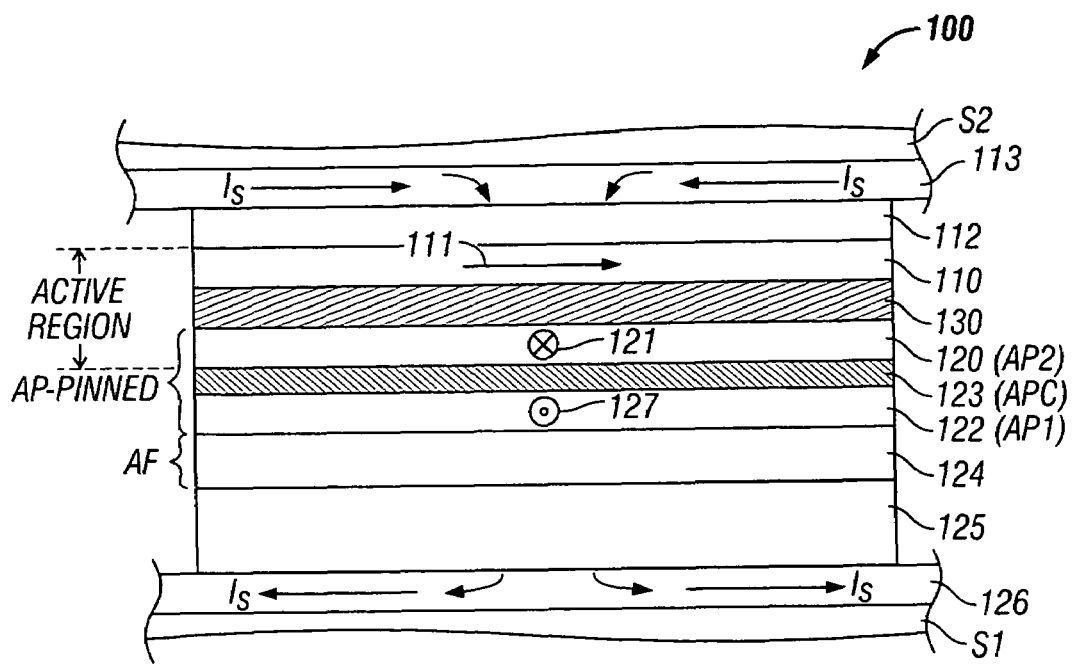
FIG. 4 is a cross-sectional schematic view of a CPP-SV read head showing the stack of layers located between the magnetic shield layers.

FIG. 4 is an enlarged sectional view showing the layers making up sensor 100. Sensor 100 is a CPP-SV read head comprising a stack of layers formed between the two magnetic shield layers S1, S2 that are typically electroplated NiFe alloy films. The lower shield S1 is typically polished by chemical-mechanical polishing (CMP) to provide a smooth substrate for the growth of the sensor stack. This may leave an oxide coating which can be removed with a mild etch just prior to sensor deposition. The sensor layers include a reference ferromagnetic layer 120 having a fixed magnetic moment or magnetization direction 121 oriented transversely (into the page), a free ferromagnetic layer 110 having a magnetic moment or magnetization direction 111 that can rotate in the plane of layer 110 in response to transverse external magnetic fields from the disk 12, and an electrically conducting spacer layer 130, typically copper (Cu), between the reference layer 120 and free layer 110.

The reference layer 120 is part of the well-known antiparallel (AP) pinned structure, also called a "laminated" pinned layer, as described in U.S. Pat. No. 5,465,185. The AP-pinned structure minimizes magnetostatic coupling of the reference layer 120 with the free layer 110. The AP-pinned structure includes the reference ferromagnetic (AP2) layer 120 and a lower ferromagnetic (AP1) layer 122 that are antiferromagnetically coupled across an AP coupling (APC) layer 123, such as Ru, Ir, Rh, or Cr, or alloys thereof. The free ferromagnetic layer 110, spacer layer 130 and AP2 layer 120 together make up what is call the "active region" of the sensor. The AP1 and AP2 ferromagnetic layers have their respective magnetization directions 127, 121 oriented antiparallel. The AP-pinned structure may be "self-pinned" or the AP1 layer 122 may have its magnetization direction pinned by being exchange-coupled to an antiferromagnetic (AF) layer 124 or pinned by a hard magnetic layer such as $Co_{100-x}Pt_x$ or $Co_{100-x-y}Pt_xCr_y$ (where x is between about and 8 and 30 atomic percent). In a "self pinned" sensor the AP1 and AP2 layer magnetization directions 127, 121 are typically set generally perpendicular to the disk surface by magnetostriction and the residual stress that exists within the fabricated sensor. It is desirable that the AP1 and AP2 layers have similar but not equal magnetic moments. This assures that the net magnetic moment of the AP-pinned structure is small so that magnetostatic coupling to the free layer is minimized and the effective pinning field of the AF layer 124, which is approximately inversely proportional to the net magnetization of the AP-pinned structure, remains high. In the case of a hard magnetic pinning layer, the hard magnetic pinning layer moment needs to be accounted for when balancing the moments of AP1 and AP2 to minimize magneto-static coupling to the free layer.

Located between the lower shield layer S1 and the AP-pinned structure are the bottom electrical lead 126 and a seed layer 125. The seed layer 125 may be a single layer or multiple layers of different materials. Located between the free ferromagnetic layer 110 and the upper shield layer S2 are a capping layer 112 and the top electrical lead 113. The capping layer 112 may be a single layer or multiple layers of different materials, such as a Cu/Ru/Ta trilayer.

In the presence of an external magnetic field in the range of interest, i.e., magnetic fields from recorded data on the disk 12, the magnetization direction 111 of free layer 110 will rotate while the magnetization direction 121 of reference layer 120 will remain fixed and not rotate. Thus when a sense current $I_S$ is applied from top lead 113 perpendicularly through the stack to bottom lead 126, the magnetic fields from the recorded data on the disk will cause rotation of the free-layer magnetization 111 relative to the reference-layer magnetization 121, which is detectable as a change in electrical resistance.

The leads 126, 113 are typically Ta or Rh. However, a lower resistance material may also be used. They are optional and used to adjust the shield-to-shield spacing. If the leads 126 and 113 are not present, the bottom and top shields S1 and S2 are used as leads. The seed layer 125 is typically one or more layers of NiFeCr, NiFe, Ta, Cu or Ru. The AF layer 124 is typically a Mn alloy, e.g., PtMn, NiMn, FeMn, IrMn, PdMn, PtPdMn or RhMn. If a hard magnetic layer is used instead of an AF layer it is typically a CoPt or FePt alloy, for example CoPtCr. The capping layer 112 provides corrosion protection and is typically formed of Ru or Ta.

The ferromagnetic layers 122 (AP1), 120 (AP2), and 110 (free layer) are typically formed of face-centered-cubic (fcc) crystalline CoFe or NiFe alloys, or a multilayer of these materials, such as a CoFe/NiFe bilayer. These alloys have a sufficiently high magnetic moment M and bulk electron scattering parameter $\beta$, but a relatively low electrical resistivity $\rho$. For example, for $Co_{84}Fe_{16}$, $\rho$ is approximately 10.6 $\mu\Omega$-cm and M is approximately 1550 emu/cc.

The AP2 layer can also be a laminated structure to obtain a high degree of spin-dependent interface scattering. For example the AP2 layer can be a FM/XX/FM/.../XX/FM laminate, where the ferromagnetic (FM) layers are formed of Co, Fe or Ni, one of their alloys, or a multilayer of these materials, such as a CoFe—NiFe—CoFe trilayer; and the XX layers are nonmagnetic layers, typically Cu, Ag, or Au or their alloys, and are thin enough that the adjacent FM layers are ferromagnetically coupled.

For example, AP2 layer 120 may be a CoFe alloy, typically 10 to 30 Å thick, and the free ferromagnetic layer 110 may be a bilayer of a CoFe alloy, typically 10-15 Å thick and formed on the spacer layer 130, with a NiFe alloy, typically 10-30 Å thick, formed on the CoFe layer of the bilayer. The APC layer in the AP-pinned structure is typically Ru or Ir with a thickness between about 4-10 Å.

A hard magnetic layer (not shown), such as a CoPt or CoCrPt layer, may also be included outside the sensor stack near the side edges of the free ferromagnetic layer 110 or in the stack for magnetic stabilization or longitudinal biasing of the free ferromagnetic layer 110.

One or more of the free layer 110, the AP2 layer 120, the capping layer 112 and the conductive nonmagnetic spacer layer 130 may also include a nano-oxide layer (NOL) to locally confine the current path and increase the effective resistance of the active region. A CoFe NOL may be formed, for example, by interrupting the deposition after some CoFe has been deposited somewhere in the free layer, the AP2 layer, the capping layer, or the conductive spacer layer and oxidizing its surface for several minutes in an $O_2$ or $O_2$/Ar gas at 0.1-10 Torr. NOLs can be formed by oxidizing other materials, e.g., Cu/Al or Cu/Ti alloys or multilayers.

While the read head 100 shown in FIG. 4 is a "bottom-pinned" read head because the AP-pinned structure is below the free layer 110, the free layer 110 can be located below the AP-pinned structure. In such an arrangement the layers of the AP-pinned structure are reversed, with the AP2 layer 120 on top of and in contact with the spacer layer 130.

The present invention is the CPP-SV sensor essentially as described above, but wherein the free ferromagnetic layer 110 and/or AP2 layer 120 are formed of an amorphous alloy of one or more ferromagnetic elements Co, Fe and Ni with one or more additive nonmagnetic elements. If the CPP-SV sensor uses a conventional single pinned layer instead of the AP-pinned structure, then the single pinned layer may be formed of the amorphous alloy. The additive element or elements renders the otherwise crystalline alloy (e.g., a CoFe or NiFe alloy) amorphous and substantially increases the electrical resistivity of the layer. The amount of additive element or elements is chosen to be sufficient to render the alloy amorphous but not high enough to significantly reduce M or $\beta$. Thus the electrical resistance of the active region of the sensor is increased without a significant degradation of magnetic properties.

Examples of materials for the amorphous alloys include $Co_{(100-x-y)}Fe_xX_y$ and $Ni_{(100-x-y)}Fe_xX_y$ where X is B or Tb, and y is between about 5 and 40 atomic percent (at. %). Other nonmagnetic additive elements X can be used, such as Si, Ge, Nb, Zr, or Mg, but the amount should be chosen to assure that the material is amorphous, but still retains sufficient moment M and $\beta$. It is important to realize that an amorphous alloy may have a crystalline ground-state. In that case the amorphous state is metastable and can be realized by a non-equilibrium deposition method like sputtering. Thus an as-prepared amorphous alloy may crystallize when annealing at a sufficiently high temperature for sufficiently long time. The addition of a sufficient amount of at least one element to Co, Ni, Fe or their alloys which makes the alloy amorphous rather than crystalline will thus increase the resistivity $\rho$. The content of the additive element or elements should be high enough to make the alloy amorphous, but low enough to retain a sufficiently high moment M and sufficiently high bulk electron scattering parameter $\beta$, preferably $\beta$ of 0.3 or higher at room temperature. By way of comparison, crystalline $Co_{90}Fe_{10}$ has $\beta$ of about 0.40-0.45 at room temperature.

In one specific example of an amorphous material for use in the free layer and/or pinned layer, amorphous $Co_{84}Fe_{16}B_{20}$ has $\rho$ of 105.1 $\mu\Omega$cm and M of 1280 emu/cc. Thus the addition of 20 at. % B increases $\rho$ by a factor of about 10 without significantly reducing M. (For crystalline $Co_{84}Fe_{16}$ $\rho$ is approximately 10.6 $\mu\Omega$cm and M is approximately 1550 emu/cc).

Figure 5:
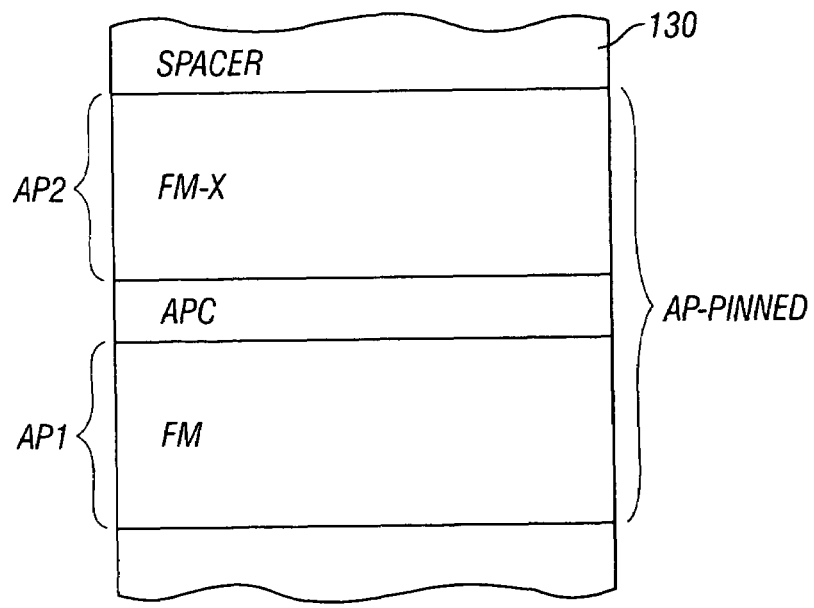
FIG. 5 is a cross-sectional schematic view of the AP-pinned structure of the present invention.

As illustrated in FIG. 5, in the CPP-SV sensor according to the invention the AP2 layer comprises a ferromagnetic (FM) material (CoFe or NiFe) that includes one or more additive elements (X), with the total additive elements being present in the alloy in an amount to render the material amorphous without significantly reducing M or $\beta$. If the AP1 layer comprises a crystalline CoFe alloy and the AP2 layer comprises the amorphous CoFeX alloy, the AP2 layer is then made thicker than the AP1 layer so that they have nearly the same magnetic moments. This is because the additive element or elements will cause the CoFeX alloy to have a lower magnetic moment than a crystalline CoFe alloy of the same thickness. The thicker AP2 layer allows for more bulk spin-dependent scattering of electrons because it utilizes more of the full spin-diffusion length of the electrons. The increased bulk spin-dependent scattering of electrons increases the magnetoresistance of the read head. In addition, it has been discovered that the use of an AP-pinned structure in a CPP-SV read head causes a decrease in magnetoresistance. This is believed due to spin scattering at the APC and AP1 interfaces and in the bulk of the AP1 layer. Thus the use of a thicker AP2 layer also places the APC and AP1 layers farther from the free layer, which reduces this adverse effect on magnetoresistance.

Figure 6:
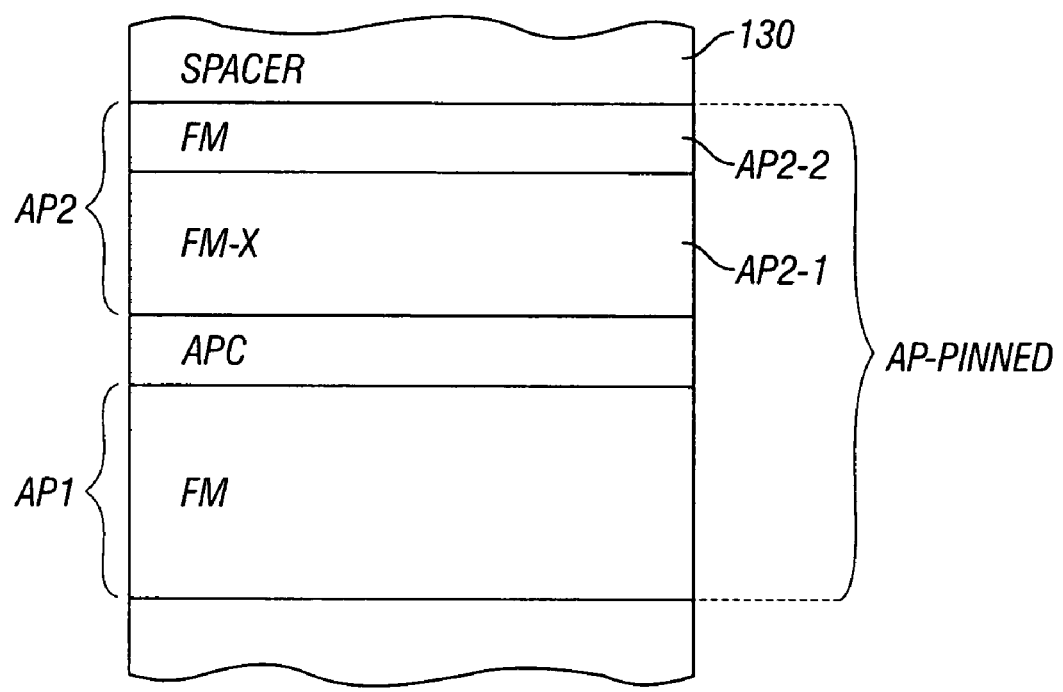
FIG. 6 is a cross-sectional schematic view of another embodiment of the AP-pinned structure of the present invention.

FIG. 6 illustrates an embodiment of the invention where the AP2 layer is a multilayer of an amorphous first ferromagnetic film (AP2-1) comprising one or more of the additive elements and a crystalline second ferromagnetic film (AP2-2) between and in contact with the first ferromagnetic film and the electrically conducting nonmagnetic spacer layer 130. The second ferromagnetic film in the AP2 layer (AP2-2), for example a crystalline CoFe alloy without any additive elements, is typically much thinner than the first film (AP2-1) and is used to insure good interfacial scattering at the spacer layer interface and to limit diffusion of the additive element (x) into the spacer layer. The order could be reversed in which case AP2-1 is a crystalline ferromagnetic film and AP2-2 is an amorphous ferromagnetic film. Moreover, AP2 may be a multilayer of amorphous and crystalline ferromagnetic films.

The invention is also applicable to AP-pinned structures wherein the AP2 layer is a FM/XX/FM/ . . . /XX/FM laminate with at least one of the ferromagnetic (FM) layers being an amorphous ferromagnetic layer. The XX layers are nonmagnetic layers, typically Cu, Ag, or Au or their alloys, and are thin enough that the adjacent amorphous FM layers are ferromagnetically coupled. This laminated AP2 layer would have at least two FM layers and one XX layer.

The amorphous ferromagnetic alloys for use in the free and pinned layers according to the invention are formed by conventional sputter deposition. However, it is important that some amorphous ferromagnetic alloys may not be annealed above a critical temperature after deposition because annealing can make the alloy crystalline. For example, $Co_{70}Fe_{10}B_{20}$ is amorphous as sputter deposited since it will be in a non-equilibrium state but will become crystalline when annealed at around 300 deg C.

The CPP-SV magnetoresistive sensor with the improved AP-pinned structure may also be a dual spin-valve sensor, like the dual spin-valve structure for use as a CIP-SV sensor described in U.S. Pat. No. 5,287,238. Referring to FIG. 4, such a sensor would have a second electrically conducting nonmagnetic spacer layer (like layer 130) formed on top of free layer 110 and a second pinned layer (like layer 120) on top of the second nonmagnetic spacer layer. The second pinned layer may be an AP-pinned structure with an AP2 layer according to this invention. Thus a dual CPP-SV sensor according to this invention would have its free layer, and/or one or both of its AP2 layers formed of an amorphous ferromagnetic alloy as described above.

The CPP-SV magnetoresistive sensor may also comprise an AP-pinned free layer. Such a sensor would have a second ferromagnetic free layer substantially antiparallel coupled to first ferromagnetic free layer by use of an APC. In the case of a bottom-pinned sensor, the first ferromagnetic free layer is in contact with the spacer layer, the second ferromagnetic free layer is in contact with the cap, shield, or top-lead structure. Such a CPP-SV sensor with an AP-pinned free layer according to this invention would have the first free layer and/or the AP2 layer formed of an amorphous ferromagnetic alloy as described above.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A current-perpendicular-to-the-plane spin-valve (CPP-SV) magnetoresistive sensor capable of sensing external magnetic fields when a sense current is applied perpendicular to the planes of the layers in the sensor, the sensor comprising:
   a substrate;
   a pinned ferromagnetic layer having an in-plane magnetization direction;
   an antiparallel-coupled free ferromagnetic layer having an in-plane magnetization direction substantially free to rotate in the presence of an external magnetic field and comprising a first free ferromagnetic layer, a second free ferromagnetic layer and an antiparallel coupling (APC) layer between the first and second free layers; and
   an electrically conductive spacer layer between the first free ferromagnetic layer and the pinned ferromagnetic layer with the first free layer being between the spacer layer and the APC layer of said free layer; wherein at least one of the first free layer and the pinned layer comprises an amorphous ferromagnetic alloy comprising a nonmagnetic element X, wherein X is selected from the group consisting of B, Tb, Si, Ge, Nb and Mg, and at least one of Co, Ni and Fe.

2. The sensor of claim 1 wherein at least one of the first free layer and the pinned layer comprises an amorphous ferromagnetic alloy having a composition selected from $Co_{(100-x-y)}Fe_xX_y$ and $Ni_{(100-x-y)}Fe_xX_y$, where X is selected from B and Tb, and y is between about 5 and 40 atomic percent.

3. The sensor of claim 1 wherein said first free layer comprises an amorphous ferromagnetic alloy comprising said nonmagnetic element X and at least one of Co, Ni and Fe.

4. The sensor of claim 1 further comprising:
   an antiparallel (AP) pinned structure comprising a first AP-pinned (AP1) ferromagnetic layer having an in-plane magnetization direction, a second AP-pinned (AP2) ferromagnetic layer having an in-plane magnetization direction substantially antiparallel to the magnetization direction of the AP1 layer, and an AP coupling (APC) layer between and in contact with the AP1 and AP2 layers, wherein the AP2 layer comprises said pinned layer.

5. The sensor of claim 4 wherein the AP-pinned structure is located between the substrate and the free ferromagnetic layer.

6. The sensor of claim 4 wherein the free ferromagnetic layer is located between the substrate and the AP-pinned structure.

7. The sensor of claim 4 wherein the AP-pinned structure is a self-pinned structure.

8. The sensor of claim 4 further comprising an antiferromagnetic layer exchange-coupled to the AP1 layer for pinning the magnetization direction of the AP1 layer.

9. The sensor of claim 4 further comprising a hard magnetic layer in contact with the AP1 layer for pinning the magnetization direction of the AP1 layer.

10. The sensor of claim 4 wherein said AP2 layer comprises an amorphous ferromagnetic alloy comprising said nonmagnetic element X and at least one of Co, Ni and Fe.

11. The sensor of claim 10 wherein the AP2 layer is adjacent to and in contact with the spacer layer.

12. The sensor of claim 10 wherein the AP2 layer comprises a multilayer of a first AP2 film, said first AP2 film comprising an amorphous ferromagnetic alloy comprising said nonmagnetic element X and at least one of Co, Ni and Fe;

and a second AP2 film comprising a crystalline alloy of one or more of Co, Fe and Ni, wherein said second AP2 film is between and in contact with said first AP2 film and the spacer layer.

13. The sensor of claim 10 wherein the AP2 layer comprises a laminate of ferromagnetic layers ferromagnetically coupled across a nonmagnetic layer, at least one ferromagnetic layer in the AP2 laminate comprising an amorphous ferromagnetic alloy comprising said nonmagnetic element X and at least one of Co, Ni and Fe.

14. The sensor of claim 10 wherein the AP1 layer and the AP2 layer have substantially the same magnetic moment.

15. The sensor of claim 1 wherein the sensor is a magnetoresistive read head for reading magnetically recorded data from tracks on a magnetic recording medium, and wherein the substrate is a first shield formed of magnetically permeable material.

16. The sensor of claim 1 wherein the sensor is a dual spin-valve sensor.

17. A current-perpendicular-to-the-plane magnetoresistive read head for reading magnetically recorded data from tracks on a magnetic recording medium, the head comprising:
a first shield layer of magnetically permeable material;
a seed layer on the first shield;
an antiparallel (AP) pinned structure comprising a first AP-pinned (AP1) ferromagnetic layer on the seed layer and having an in-plane magnetization direction, a second AP-pinned (AP2) ferromagnetic layer having an in-plane magnetization direction substantially antiparallel to the magnetization direction of the AP1 layer, and an AP coupling (APC) layer between and in contact with the AP1 and AP2 layers;
an electrically conductive nonmagnetic spacer layer on the AP2 layer;
a free ferromagnetic layer on the spacer layer and having an in-plane magnetization direction oriented substantially orthogonal to the magnetization directions of the AP1 and AP2 layers in the absence of an external magnetic field;
a capping layer on the free ferromagnetic layer; and
a second shield layer of magnetically permeable material on the capping layer; wherein the AP2 layer comprises a multilayer of a first AP2 film, said first AP2 film comprising an amorphous ferromagnetic alloy comprising a nonmagnetic element X, wherein X is selected from the group consisting of B, Tb, Si, Ge, Nb and Mg, and at least one of Co, Ni and Fe; and a second AP2 film comprising a crystalline alloy of one or more of Co, Fe and Ni, wherein said second AP2 film is between and in contact with said first AP2 film and the spacer layer.

18. A current-perpendicular-to-the-plane magnetoresistive read head for reading magnetically recorded data from tracks on a magnetic recording medium, the head comprising:
a first shield layer of magnetically permeable material;
a seed layer on the first shield;
an antiparallel (AP) pinned structure comprising a first AP-pinned (AP1) ferromagnetic layer on the seed layer and having an in-plane magnetization direction, a second AP-pinned (AP2) ferromagnetic layer having an in-plane magnetization direction substantially antiparallel to the magnetization direction of the AP1 layer, and an AP coupling (APC) layer between and in contact with the AP1 and AP2 layers;
an electrically conductive nonmagnetic spacer layer on the AP2 layer;
a free ferromagnetic layer on the spacer layer and having an in-plane magnetization direction oriented substantially orthogonal to the magnetization directions of the AP1 and AP2 layers in the absence of an external magnetic field;
a capping layer on the free ferromagnetic layer; and
a second shield layer of magnetically permeable material on the capping layer; wherein the AP2 layer comprises a laminate of two ferromagnetic layers ferromagnetically coupled across a nonmagnetic layer, at least one ferromagnetic layer in the AP2 laminate comprising an amorphous ferromagnetic alloy comprising a nonmagnetic element X, wherein X is selected from the group consisting of B, Tb, Si, Ge, Nb and Mg, and at least one of Co, Ni and Fe.

* * * * *